United States Patent [19]
Tiemeijer

[11] Patent Number: 5,790,302
[45] Date of Patent: Aug. 4, 1998

[54] SEMICONDUCTOR DIODE LASER AMPLIFIER HAVING ANTIREFLECTION LAYERS AND METHOD OF MANUFACTURING

[75] Inventor: Lukas F. Tiemeijer, Eindhoven, Netherlands

[73] Assignee: U.S. Philips Corporation, New York, N.Y.

[21] Appl. No.: 570,462

[22] Filed: Dec. 11, 1995

[30] Foreign Application Priority Data

Dec. 12, 1994 [EP] European Pat. Off. .............. 94203593

[51] Int. Cl.$^6$ .................................. H01S 3/19; H01S 3/00
[52] U.S. Cl. .................... 359/344; 359/337; 359/346; 372/45; 372/49
[58] Field of Search .................... 372/49, 45, 84, 372/99; 359/344, 337, 346

[56] References Cited

U.S. PATENT DOCUMENTS

| | | | |
|---|---|---|---|
| 4,883,684 | 11/1989 | Krekels et al. | 372/45 |
| 5,151,818 | 9/1992 | Thijs et al. | 372/45 |
| 5,196,958 | 3/1993 | Verbeek et al. | 372/45 |
| 5,282,219 | 1/1994 | Shigihara et al. | 372/49 |

OTHER PUBLICATIONS

"Polarisation–Independent Antireflection Coatings for Semiconductor Optical Amplifiers" by C. Vassallo, published in Electronics Letters, 7th Jan. 1988, vol. 24, No. 1 pp. 61–62.

*Primary Examiner*—Rodney B. Bovernick
*Assistant Examiner*—Luong-Quyen T. Phan
*Attorney, Agent, or Firm*—Steven R. Biren

[57] ABSTRACT

A semiconductor diode laser amplifier (100) includes an active layer (4) which is situated between two cladding layers (1A, (3,6)) and in which a strip-shaped active region is present which is bounded in longitudinal direction by two end faces (7,8) which are practically perpendicular to the active region and are provided each with an antireflection layer (71,81).

The amplification ripple of such a laser amplifier (100) is comparatively high, in particular when radiation of different wavelengths is present in the laser (100), such as the TE and TM portions of the radiation to be amplified.

In a laser amplifier (100), a first end face (7) is provided with a first antireflection layer (71) which has a minimum reflection at a first wavelength, for example that at which the reflection is a minimum for the TE polarized portion of the radiation to be amplified, and the second end face (8) is provided with a second antireflection layer (81) which has a minimum reflection at a second wavelength different from the first, for example that at which the reflection is a minimum for the TM polarized portion of the radiation to be amplified. The product of the reflections is a minimum for both wavelengths as a result of this, at least lower than in the known laser (100) in which both end faces (7,8) are provided with an identical antireflection layer (71,81) which is optimized for an intermediate wavelength. The laser (100) has a particularly low amplification ripple because this ripple is indeed proportional to the square root of said product of reflections. Good results are obtained with antireflection layers (71,81) which include only a single layer, preferably made of silicon oxynitride.

6 Claims, 1 Drawing Sheet

SEMICONDUCTOR DIODE LASER AMPLIFIER HAVING ANTIREFLECTION LAYERS AND METHOD OF MANUFACTURING

BACKGROUND OF THE INVENTION

The invention relates to a semiconductor diode laser amplifier, often referred to as laser amplifier for short hereinafter, with a semiconductor body comprising a substrate of a first conductivity type and situated thereon a semiconductor layer structure with at least a first cladding layer of the first conductivity type, an active layer, a second cladding layer of a second conductivity type opposed to the first, the second cladding layer and the substrate being electrically connected to connection conductors, and comprising a pn junction which, given a sufficient current strength in the forward direction, is capable of amplifying coherent electromagnetic radiation in a strip-shaped active region which is bounded in longitudinal direction by two end faces which are substantially perpendicular to the active region and which are each provided with an antireflection layer.

Such a laser amplifier is used in particular as an optical amplifier in glass fibre communication systems.

Such a laser amplifier is known from the article "Polarization-independent antireflection coatings for semiconductor optical amplifiers" by C. Vassallo, published in Electronics Letters of 7 Jan., 1988, Vol. 24, No. 1, pp. 61–62. FIG. 1 therein diagrammatically shows the laser amplifier described above in longitudinal sectional view. A cladding layer is identified with "cladding" and the active layer with "core". The only end face shown is coated with an antireflection layer which comprises two sub-layers. Owing to the rectangular geometry of the active layer, the TE (=Transverse Electric field) polarized portion of the radiation is subject to a different refractive index than is the TM (=Transverse Magnetic field) polarized portion upon passage through the active region. As a result, said portions of the radiation to be amplified have different effective path lengths in the antireflection layer. The wavelengths for which the reflection is a minimum, therefore, are also different. It is proposed in the above publication to use a single- or multi-layer coating for the antireflection layer, which coating is optimized for radiation having an average wavelength in the antireflection layer, i.e. for radiation having a wavelength which lies approximately halfway between the wavelengths corresponding to a minimum in the reflection for the TE and TM polarized portions of the radiation to be amplified.

A disadvantage of the known laser amplifier is that the quantity of amplification ripple is not minimal because the antireflection layer retains a certain residual reflection for the TE as well as for the TM polarized portion of the radiation to be amplified owing to the chosen compromise. A too great amplification ripple means that the laser amplifier is difficult to control and is less linear. In addition, the manufacture of a multi-layer antireflection layer is comparatively complicated, which renders the laser amplifier expensive.

SUMMARY OF THE INVENTION

It is an object of the present invention, therefore, to provide a laser amplifier of the kind mentioned in the opening paragraph whose amplification ripple is as low as possible. Another object is to provide a laser amplifier whose manufacture is comparatively simple.

According to the invention, a laser amplifier of the kind mentioned in the opening paragraph is for this purpose characterized in that the first end face is provided with a first antireflection layer which has a minimum reflection at a first wavelength and the second end face is provided with a second antireflection layer which has a minimum reflection at a second wavelength different from the first. It is achieved thereby that, when radiation of two different wavelengths is present in the laser amplifier, one reflection is a minimum for each of these two wavelengths. It was surprisingly found that the product of the reflections at the two end faces is a minimum for each of the two wavelengths in practice as a result of this. This means that said product is lower than if, as in the known laser amplifier, an antireflection layer were provided on both end faces optimized for an intermediate wavelength. Since the value of the amplification ripple of the laser amplifier is proportional to the square root of said product of the reflections, a laser amplifier according to the invention has a lower amplification ripple than the known laser amplifier, and is accordingly easier to control and has a better linearity. Moreover, the antireflection layer need not comprise more than one single layer because each end face is optimized for one wavelength (albeit a different wavelength for each end face). This renders the manufacture of the laser amplifier according to the invention simple, and accordingly inexpensive.

The invention is based on the following recognition in the case in which a minimum reflection is actually zero. The reflection for each of the two wavelengths will differ from the minimum reflection, and accordingly from zero, at both end faces when optimized for an intermediate wavelength. Said product of the reflections at both end faces for each of the two wavelengths accordingly also differs from zero. In the laser amplifier according to the invention, said product is zero for each of the two wavelengths because one factor of said product is zero each time. In practice, a minimum reflection equal to zero cannot be realised. It will be made clear with reference to an embodiment to be discussed further below that a laser amplifier according to the invention will have a lower product of the reflections at both end faces also in this case, and accordingly can have a lower amplification ripple.

In a first embodiment of a laser amplifier according to the invention, both the first and the second antireflection layer comprise no more than one layer. A minimum reflection can be realised in a simple manner for exactly one wavelength by means of a single layer. This is done through the choice of a suitable refractive index, and accordingly through the choice of a suitable material for this layer, and the choice of a suitable optical thickness of the layer. Such a laser amplifier can be manufactured in a simple, accurate, and reproducible manner, which is an important advantage. Preferably, a silicon oxynitride is chosen as the material for the antireflection layers. This material has a suitable refractive index of approximately 1.8. This refractive index, moreover, may be readily varied through a variation in the composition. The material is also easy to apply, for example, through sputtering.

In a preferred embodiment, the laser amplifier is a laser amplifier of the travelling wave type. Such amplifiers are highly suitable for use in an optical glass fibre communication system in the wavelength range from approximately 1.3 to approximately 1.5 μm. The semiconductor material system corresponding thereto comprises InP/InGaAs(P). Particularly when such an amplifier is used in a LAN (=Local Area Network), it should be suitable for amplifying radiation of two different wavelengths, for example radiation of 1.3 µm wavelength and radiation of 1.5 µm wavelength. One of the two antireflection layers is then optimized for the one wavelength, the other layer for the other wavelength.

In another modification which is also highly attractive, the radiation to be amplified in a laser amplifier according to the invention has only one wavelength, for example 1.3 µm radiation. In that case, the first wavelength corresponds, for example, to that wavelength for which the reflection of the TE polarized portion of the radiation to be amplified is a minimum, while the second wavelength is that for which the reflection of the TM polarized portion of said radiation is a minimum. In the case of 1.3 µm radiation, for example, the first wavelength is then 1.290 µm and the second wavelength, for example, 1.320 µm. Preferably, the active region of the laser amplifier has a periodic variation in the effective refractive index in longitudinal direction over at least part of its length. Such a periodic variation in the effective refractive index offers the possibility of realising some laser action in the laser amplifier besides the amplification, so that the amplification is stabilized, which benefits the linearity of the amplification.

According to the invention, a method of manufacturing a semiconductor diode laser amplifier, by which method the following are provided on a semiconductor substrate of a first conductivity type in that order: at least a first cladding layer of the first conductivity type, an active layer, and a second cladding layer of a second conductivity type opposed to the first, the second cladding layer and the substrate being connected to connection conductors, while in the active layer a strip-shaped active region is formed adjacent a pn junction which, given a sufficient current strength in the forward direction, is capable of amplifying coherent electromagnetic radiation, which active region is bounded in longitudinal direction by a first and a second end face which end faces are substantially perpendicular to the active region and are provided with antireflection layers, is characterized in that a first end face is provided with a first antireflection layer whose composition and thickness are chosen such that it has a minimum reflection at a first wavelength, and the second end face is provided with a second antireflection layer whose thickness and composition are chosen such that it has a minimum reflection at a second wavelength different from the first. A laser amplifier according to the invention is obtained in a simple manner by such a method, in particular a laser amplifier according to the invention. Preferably, a single layer only is provided of a different material on each of the two end faces.

BRIEF DESCRIPTION OF THE DRAWINGS

The invention will now be explained in more detail with reference to an embodiment and the accompanying drawing, in which.

The Figures are diagrammatic and not drawn to scale, the dimensions in the thickness direction being particularly exaggerated for greater clarity. Corresponding parts have generally been given the same reference numerals in the Figures.

DESCRIPTION OF THE PREFERRED EMBODIMENTS

Figure 1:
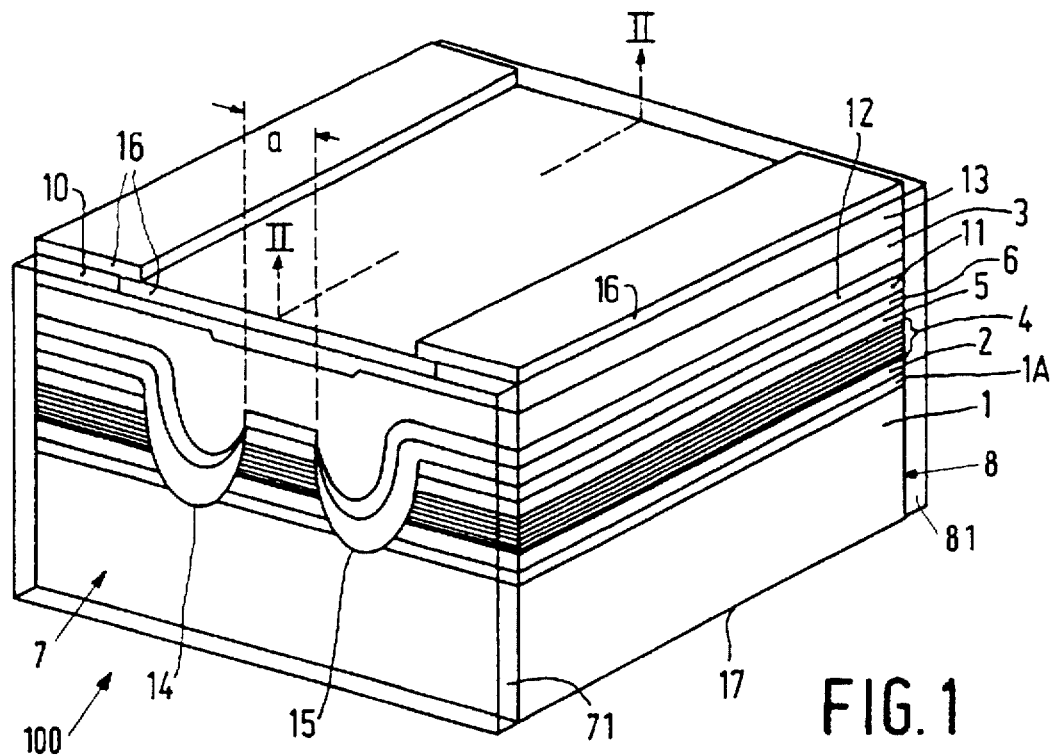
FIG. 1 diagrammatically shows an embodiment of a semiconductor diode laser amplifier according to the invention, partly in perspective view and partly in cross-section, and FIG. 2 diagrammatically shows the laser amplifier of FIG. 1 in a cross-section taken on the line II—II.
Figure 2:
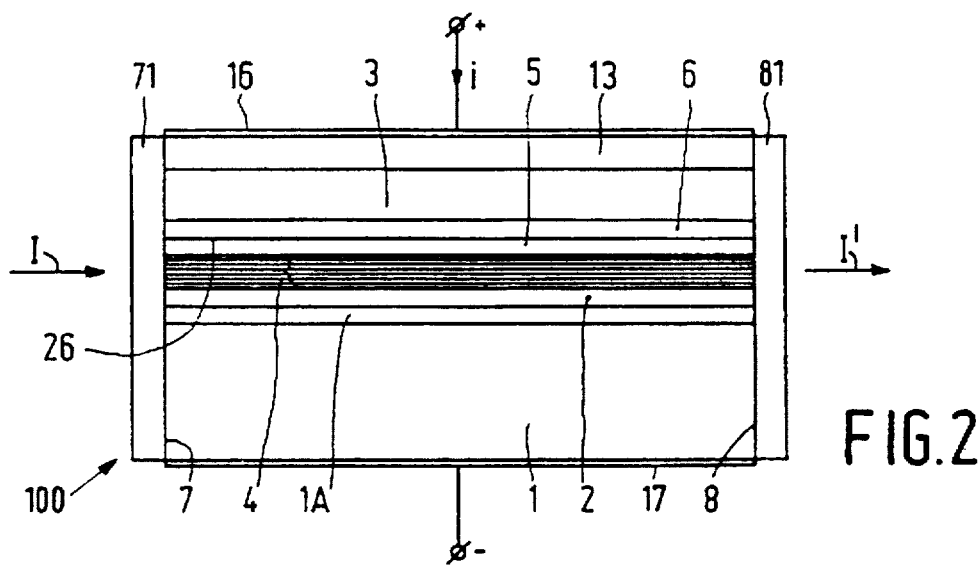

FIG. 1 diagrammatically shows an embodiment of a laser amplifier according to the invention, partly in perspective view and partly in cross-section, and FIG. 2 diagrammatically shows the laser amplifier of FIG. 1 in a cross-section taken on the line II—II in FIG. 1. The laser amplifier 100 has a semiconductor body comprising a substrate 1 of a first, here the n-conductivity type and made of InP (doping, for example, $5 * 10^{18}$ at/cm$^3$), and a layer structure situated thereon. This layer structure comprises an n-type buffer layer 1A which forms a first cladding layer, a first separate confinement layer 2 of $In_xGa_{1-x}As_yP_{1-y}$ (x=0.88 and y=0.25), a second separate confinement layer 5 with the same properties as the first separate confinement layer 2, a second cladding layer 3,6 of a second conductivity type opposed to the first, so here the p-type, and made of InP, a contact layer 13 of the second conductivity type, so here the p-type and made of $In_xGa_{1-x}As_yP_{1-y}$ (x=0.73 and y=0.60), and between the cladding layers 1A and 3,6 an active layer 4 which in this example is situated between the separate confinement layers 2 and 5. The active layer 4 in this example comprises seven quantum well (=QW) layers of a semiconductor material having a direct band transition, in this example $In_xGa_{1-x}As_yP_{1-y}$, which are mutually separated by 12.5 nm thick barrier layers of the same material as the separate confinement layers. Four QW layers have a compression stress (x=0.83 and y=0.67) and a thickness of 4.5 nm, the other three QW layers have a tensile stress (x=0.50 and y=0.78) and are 11 nm thick. As a result, the laser amplifier 100 in this example has a high gain already at a low current strength, while in addition this gain is substantially insensitive to polarization. The latter means that both the TE and the TM polarized portion of the radiation to be amplified, whose wavelength is, for example, 1.3 µm, are equally amplified. The thickness of the cladding layers 1A and 3,6 is approximately 1 µm, and their doping concentration is approximately $5 * 10^{17}$ to $1 * 10^{18}$ at/cm$^3$. The separate confinement layers 2 and 5 are approximately 50 nm thick and are not intentionally doped, which means that they are lightly n-type. The latter also holds for the QW layers and the barrier layers. The not intentionally doped layers 2, 5 and the barrier layers may alternatively have an n-type doping. The contact layer 13 is approximately 0.5 µm thick and has a doping concentration of approximately $10^{19}$ at/cm$^3$. In addition, said layer structure has a pn junction 26 which is situated between the cladding layers 2 and 3,6 and which in this example adjoins the p-type layer 3. The second cladding layer 3 and the substrate 1 are electrically connected to connection conductors in the form of metal layers 16 and 17 through which a current i can be supplied in forward direction to the pn junction 6. Given a sufficient strong current (i) in the forward direction through the pn junction 26, amplification of electromagnetic radiation (I) will take place within a stripshaped active region of the active layer 4 for certain wavelengths. The active region 4 then has a greater effective refractive index for the radiation I to be amplified and a smaller bandgap than the first (1A) and second (3,6) cladding layers. Since the active region has a rectangular cross-section, the TE polarized portion of radiation (I) experiences a different refractive index in the amplifier than does the TM polarized portion of this radiation (I). As a result, the wavelength for which the reflection is a minimum is different for these two portions of the radiation, being 1.290 µm and 1.320 µm, respectively, in this case. The strip-shaped active region, whose width is diagrammatically indicated with a in FIG. 1, is bounded by end faces 7,8 which are substantially perpendicular to the active layer 4, serve as input and output surfaces of the radiation I to be amplified, and which are low-reflecting owing to the presence of antireflection layers 71,81.

According to the invention, a first end face 7 is provided with a first antireflection layer 71 which has a minimum reflection for a first wavelength, here 1.290 μm, corresponding to the wavelength for which the reflection is a minimum in the case of TE polarization, while a second end face 8 is provided with a second antireflection layer 81 which has a minimum reflection for a second wavelength different from the first, here 1.320 μm, corresponding to the wavelength for which the reflection is a minimum in the case of TM polarization. In the case of 1.3 μm radiation to be amplified, exactly one reflection at one end face 7,8 is a minimum for the TE and for the TM polarization. As a result, the product of the reflections at each of the two end faces 7,8 is a minimum in a laser amplifier 100 according to the invention both for the TE and for the TM polarization. The laser amplifier 100 according to this example thus has a minimum amplification ripple.

Thanks to the presence of the antireflection layers 71,81, the laser amplifier 100 is of the travelling wave type, which type is most suitable for use in an optical glass fibre communication system. In the laser amplifier 100 used here, the active region is provided with a periodic variation in the effective refractive index in longitudinal direction, here in the form of a grating (not shown in the Figures) which lies adjacent the active layer 4. The laser amplifier 100 is well controllable as a result of this, and laser operation is possible besides amplification, which (further) improves the linearity.

An important advantage of a laser amplifier 100 according to the invention is that a low amplification ripple can be realised with the antireflection layers 71,81 which, as in the present example, each comprise only a single layer 71,81. The antireflection layers 71,81 here comprise a silicon oxynitride whose composition and thickness are chosen as indicated below. The determination of said quantities is based on a number of experimental relationships which are expressed in the equations (1) to (4).

$$n_{TE}=0.97*n \tag{1}$$

$$d_{TE}=0.95*d \tag{2}$$

$$n_{TM}=0.99*n \tag{3}$$

$$d_{TM}=0.97*d. \tag{4}$$

In these equations, n and d are the refractive index and the thickness, respectively, of an antireflection layer 71,81. The refractive index of the laser amplifier 100 is referred to as $n_h$ hereinafter. In this example, the first antireflection layer 71 is optimized for the TE portion of the 1.3 μm radiation according to the invention. This means that $n_{TE}=\sqrt{n_h}=0.97*n$, so that n for the first antireflection layer 71 is equal to $\sqrt{3.2}/0.97=1.844$. The refractive indices of $SiO_2$ and $Si_3N_4$ are 1.465 and 1.990, respectively. So the antireflection layer 71 comprises 28 at % $SiO_2$ and 72 at % $Si_3N_4$, corresponding to $SiO_{0.46}N_{1.18}$ in the silicon oxynitride used. The following holds for the thickness: $d_{TE}=\frac{1}{4}*(\lambda/n)=0.25*(1.290/1.844)=0.95*d$, so d of the first antireflection layer 71 is equal to $(0.25/0.95)*(1.290/1.844)=0.1802$ μm = 180.2 μm. In this embodiment, the second antireflection layer 81 is optimized for the TM portion of the 1.3 μm radiation according to the invention. This means that $n_{TM}=\sqrt{n_h}=0.99*n$, so that n of the second antireflection layer 81 is equal to $\sqrt{3.2}/0.997=1.807$. The antireflection layer 81 accordingly comprises 35 at % $SiO_2$ and 65 at % $Si_3N_4$, corresponding to $SiO_{0.30}N_{0.85}$ in the silicon oxynitride used. It holds for the thickness that: $d_{TM}=\frac{1}{4}*(\lambda/n)=0.25*(1.320/1.807)=0.97*d$, so that d (the thickness of the second antireflection layer 81) is chosen to be equal to $(0.25/0.97)*(1.320/1.807)=0.1883$ μm =188.3 nm.

The advantage of a laser amplifier 100 according to the invention can be quantified as follows. It holds for the reflection (R) at an end face 7,8 provided with an antireflection layer 71,81 that:

$$R=|r_a+r_b*e^{i\phi}|^2=r_a^2+r_b^2+2*r_a*r_b*\cos(\phi) \tag{5}$$

with $$r_a=(n_h-n)/(n_h+n) \text{ en} \tag{6}$$

$$r_b=(n-1)/(n+1) \tag{7}$$

in which $r_a$ is the reflection at an end face 7,8, $r_b$ is the reflection at the boundary between an antireflection layer 71,81 and air, and ϕ is the phase difference between the two reflections. It holds for ϕ that:

$$\phi=4*\pi*d/\lambda \tag{8}$$

When $\lambda_0$ is defined as 4d, and $\Delta\lambda$ as $\lambda-\lambda_0$, then (8) becomes:

$$\phi=-\pi*\Delta\lambda/\lambda+\pi \tag{9}$$

Using $\cos(-\delta+\pi)=-\cos(\delta)$ and $\cos(\delta)=1-\delta^2/2$ when $\delta<<1$, (9) may be reduced to:

$$\cos(\phi)=(\frac{1}{2})*(\pi*\Delta\lambda/\lambda)^2-1 \tag{10}$$

so that (5) can be rewritten:

$$R=(r_a-r_b)^2+r_a*r_b*(\pi*\Delta\lambda/\lambda)^2 \tag{11}$$

When $\Delta n$ is defined as $n-\sqrt{n_h}$, (11) can be reduced to, after completion, working-out and ignoring:

$$R=(4*\Delta n/(\sqrt{n_h}+1)^2)^2+(((\sqrt{n_h}-1)/(\sqrt{n_h}+1))*(\Delta\lambda/\lambda))^2 \tag{12}$$

with $n_h=3.2$ and $\Delta=1.3$ (μm), becomes (12):

$$R=0.26*(\Delta n)^2+0.47*(\Delta\lambda)^2 \tag{13}$$

The following uncertainties: $\Delta n=0.003$, $\Delta d/d=0.005$, and accordingly $\Delta\lambda=0.0065$ (μm) hold for an antireflection layer 71,81 made of a silicon oxynitride (n=1.8). Substitution thereof in (13) yields a minimum reflection value $R=2.2*10^{-5}$. It is true for the ideal antireflection layer 71 for the TE polarized portion of the 1.3 μm radiation that $n_{TE}=\sqrt{n_h}=0.97*n$, and $4*d_{TE}=\lambda=3.8*d$, from which it follows that $n=1.03*\sqrt{n_h}$, and $d=0.263*\lambda$. It holds for the ideal antireflection layer 81 for the TM polarized portion of the 1.3 μm radiation that $n_{TM}=\sqrt{n_h}=0.99*n$, and $4*d_{TM}=\lambda=3.88*d$, from which it follows that $n=1.04*\sqrt{n_h}$ and $d=0.257*\lambda$.

It follows from the above that the following is true for an antireflection layer which is equally satisfactory for both polarizations, such as the known antireflection layer: $n=1.02*\sqrt{n_h}$ and $d=0.26*\lambda$. It is true in that case for both the TE and the TM portion of the radiation that: $|\Delta n|=0.018$ and $|\Delta\lambda|=0.013$. Substitution thereof in (13) leads to a reflection value $R=1.6*10^{-4}$.

In a laser amplifier 100 according to the invention, it is true for both portions of the 1.3 μm radiation at one end face 7,8 that: $R=2.2*10^{-5}$, corresponding to the minimum reflection at an end face 71,81 as calculated above. It is then true for each of the two portions of the radiation at that end face 7,8 of the laser amplifier 100 where the antireflection layer 71,81 is not optimal for the relevant portion of the radiation that: $|\Delta n|=0.036$, and $|\Delta \lambda|=0.026$. Substitution thereof in (13) yields: $R=6.4*10^{-4}$. This means that the square root of the product of the reflections at both end faces 7,8 is equal to $R=\sqrt{(2.2*10^{-5}*6.4*10^{-4})}=1.2*10^{-4}$ for both the TE portion and the TM portion of the 1.3 μm radiation. This means an improvement of 25% relative to a single-layer known antireflection layer.

Given a smaller tolerance by a factor two in the layer thickness of the antireflection layers 71,81, we get: $\Delta n=0.003$, $\Delta d/d=0.0025$, and accordingly $\Delta \lambda=0.0033$ (μm). This gives a minimum reflection $R=7.3*10^{-6}$. For the laser amplifier 100 according to the invention this means that the square root of the product of the reflections at the two end faces 7,8 becomes: $R=\sqrt{(6.4*10^{-4}*7.3*10^{-6})}=6.8*10^{-5}$. This is an improvement by a factor two over a single-layer known antireflection layer.

The optical amplifier in the present example has the DCPBH (=Double Channel Planar Buried Hetero) structure which is often used for optical communication. The invention, however, is by no means limited to this structure. Alternative structures such as a SIPBH (=Semi Insulating Planar Buried Hetero) structure may be used. The DCPBH structure of the present example further comprises a current-limiting layer structure. This comprises two grooves 14 and 15 which bound the strip-shaped amplification region and in which a layer 11 of p-type InP with a thickness (outside the grooves) of approximately 0.3 μm and with a doping concentration of approximately $2\times10^{18}$ at/cm$^3$ and a blocking layer 12 of n-type InP with a doping concentration of approximately $10^{18}$ at/cm$^3$ and a thickness of approximately 0.5 μm are applied. The layers 11 and 12 do not extend over the strip-shaped portion of the layer 5 situated between the grooves 14 and 15, so that the p-type second cladding layer 3,6 in said portion directly adjoins the second separate confinement layer 5. A silicon dioxide layer 10 is further provided over the contact layer 13, in which layer 10 a slotted opening is formed within which an electrode layer 16 provided on the upper surface makes contact with the layer 13.

The manufacture of such a DCPBH structure is described in detail inter alia in European Patent Application by Applicant published under No. EP 259.919, so that it need not be discussed any further here. The silicon oxynitride antireflection layers 71,81 are provided here by means of RF magnetron sputtering. The invention, however, is not limited to the materials chosen for the antireflection layers 71,81 chosen here, or to the technology for applying said layers 71,81 chosen here.

It is further noted that the advantage of antireflection layers 71,81 according to the invention increases as the difference between the first and the second wavelength becomes greater. This can be seen from equation (13), for which it is noted that this equation is sufficiently accurate as long as $\pi*\Delta\lambda/\lambda$ is small. For $\pi*\Delta\lambda/\lambda<0.6$, the difference between the left and right terms members of equation (10) is smaller than 1% (absolute) and smaller than 5% (relative). This corresponds to $\Delta\lambda=0.25$ μm for $\lambda=1.3$ μm and $\Delta\lambda=0.3$ μm for $\lambda=1.5$ μm.

It is finally noted that many variations are possible to those skilled in the art within the scope of the invention. Thus different (semiconductor) materials, compositions, or thicknesses than those mentioned in the example may be used. It is also possible to replace all conductivity types simultaneously with their opposites. Furthermore, alternative techniques may be used for applying the (semiconductor) layers mentioned in the example.

I claim:

1. A semiconductor diode laser amplifier (100) with a semiconductor body (100) comprising a substrate (1) of a first conductivity type and situated thereon a semiconductor layer structure with at least a first cladding layer (1A) of the first conductivity type, an active layer (4), a second cladding layer (3,6) of a second conductivity type opposed to the first, the second cladding layer (3,6) and the substrate (1) being electrically connected to connection conductors (16,17), and comprising a pn junction (26) which, given a sufficient current strength in the forward direction, is capable of amplifying coherent electromagnetic radiation in a strip-shaped active region which is bounded in a longitudinal direction by two end faces (7,8) which are substantially perpendicular to the active region and which are each provided with an antireflection layer (71,81), characterized in that the first end face (7) is provided with a first antireflection layer (71) which has a single minimum reflection at a first wavelength and the second end face (8) is provided with a second antireflection layer (81) which has a single minimum reflection at a second wavelength different from the first, in that the first wavelength corresponds to the wavelength at which the reflection of the TE polarized portion of radiation to be amplified in the semiconductor diode laser amplifier (100) is a minimum, and the second wavelength corresponds to the wavelength at which the reflection of the TM polarized portion of the radiation to be amplified in the semiconductor diode laser amplifier (100) is a minimum.

2. A semiconductor diode laser amplifier as claimed in claim 1, characterized in that both the first and the second antireflection layer (71,81) comprise only a single layer.

3. A semiconductor diode laser amplifier as claimed in claim 1, characterized in that the first and the second antireflection layer (71,81) comprise a silicon oxynitride.

4. A semiconductor diode laser amplifier as claimed in claim 1, characterized in that the semiconductor diode laser amplifier (100) is a laser amplifier (100) of the travelling wave type.

5. A semiconductor diode laser amplifier as claimed in claim 1, characterized in that the active region of the laser has a periodic variation in the effective refractive index in longitudinal direction over at least part of its length.

6. A semiconductor diode laser amplifier as claimed in claim 1, characterized in that the semiconductor body comprises semiconductor layers in the InP/InGaAs(P) material system, and the first and the second wavelength lie between approximately 1.3 μm and approximately 1.5 μm.

* * * * *